United States Patent
Oganesian et al.

(10) Patent No.: US 9,355,901 B2
(45) Date of Patent: May 31, 2016

(54) NON-LITHOGRAPHIC FORMATION OF THREE-DIMENSIONAL CONDUCTIVE ELEMENTS

(71) Applicant: Tessera, Inc., San Jose, CA (US)

(72) Inventors: Vage Oganesian, Sunnyvale, CA (US); Belgacem Haba, Saratoga, CA (US); Ilyas Mohammed, Santa Clara, CA (US); Craig Mitchell, San Jose, CA (US); Piyush Savalia, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 14/686,222

(22) Filed: Apr. 14, 2015

(65) Prior Publication Data

US 2015/0221551 A1 Aug. 6, 2015

Related U.S. Application Data

(63) Continuation of application No. 14/243,484, filed on Apr. 2, 2014, now Pat. No. 9,018,769, which is a continuation of application No. 12/842,669, filed on Jul. 23, 2010, now Pat. No. 8,697,569.

(51) Int. Cl.
*H01L 21/4763* (2006.01)
*H01L 21/768* (2006.01)
(Continued)

(52) U.S. Cl.
CPC .... *H01L 21/76879* (2013.01); *H01L 21/76802* (2013.01); *H01L 21/76898* (2013.01);
(Continued)

(58) Field of Classification Search
CPC .................. H01L 21/76898; H01L 23/5226; H01L 21/76879; H01L 2924/00; H01L 2924/12042
USPC ........................................................ 438/629
See application file for complete search history.

(56) References Cited

U.S. PATENT DOCUMENTS 6,684,007 B2 1/2004 Yoshimura et al.
8,288,853 B2 10/2012 Huang et al.
(Continued)

FOREIGN PATENT DOCUMENTS

TW 200609991 3/2006
TW 200947659 11/2009

OTHER PUBLICATIONS

International Search Report, PCT/US1052633, Dated Dec. 13, 2010.
(Continued)

*Primary Examiner* — David S Blum
(74) *Attorney, Agent, or Firm* — Lerner, David, Littenberg, Krumholz & Mentlik, LLP

(57) ABSTRACT

A method of forming a conductive element on a substrate and the resulting assembly are provided. The method includes forming a groove in a sacrificial layer overlying a dielectric region disposed on a substrate. The groove preferably extends along a sloped surface of the substrate. The sacrificial layer is preferably removed by a non-photolithographic method, such as ablating with a laser, mechanical milling, or sandblasting. A conductive element is formed in the groove. The grooves may be formed. The grooves and conductive elements may be formed along any surface of the substrate, including within trenches and vias formed therein, and may connect to conductive pads on the front and/or rear surface of the substrate. The conductive elements are preferably formed by plating and may or may not conform to the surface of the substrate.

20 Claims, 18 Drawing Sheets

(51) Int. Cl.
*H01L 23/48* (2006.01)
*H01L 23/522* (2006.01)
*H01L 23/00* (2006.01)
*H01L 23/498* (2006.01)

(52) U.S. Cl.
CPC .......... *H01L23/481* (2013.01); *H01L 23/5226* (2013.01); *H01L 24/06* (2013.01); *H01L 23/4985* (2013.01); *H01L 2924/12042* (2013.01); *H01L 2924/1461* (2013.01)

(56) References Cited

U.S. PATENT DOCUMENTS

| | | |
|---|---|---|
| 2005/0140265 A1 | 6/2005 | Hirakata |
| 2007/0243706 A1 | 10/2007 | Komuro |
| 2008/0032519 A1 | 2/2008 | Murata |
| 2008/0113505 A1 | 5/2008 | Sparks et al. |
| 2008/0156518 A1 | 7/2008 | Honer et al. |
| 2009/0200679 A1 | 8/2009 | Harada et al. |
| 2009/0243083 A1 | 10/2009 | Han et al. |
| 2010/0148370 A1 | 6/2010 | Han |
| 2010/0258948 A1 | 10/2010 | Tanaka et al. |
| 2010/0327422 A1 | 12/2010 | Lee et al. |
| 2011/0260284 A1 | 10/2011 | Schrank et al. |

OTHER PUBLICATIONS

Taiwanese Office Action for Application No. 099140225 dated Dec. 13, 2013.

NON-LITHOGRAPHIC FORMATION OF THREE-DIMENSIONAL CONDUCTIVE ELEMENTS

CROSS-REFERENCE TO RELATED APPLICATIONS

The present application is a continuation of U.S. patent application Ser. No. 14/243,484, now U.S. Pat. No. 9,018, 769, filed Apr. 2, 2014 which is a continuation of U.S. patent application Ser. No. 12/842,669, now U.S. Pat. No. 8,697, 569, filed Jul. 23, 2010, the disclosures of which are hereby incorporated herein by reference.

BACKGROUND OF THE INVENTION

The present invention relates to packaging of microelectronic devices, especially the packaging of semiconductor devices.

Microelectronic devices generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 µm thick. The bond pads could include a single layer or multiple layers of metal. The size of the bond pads will vary with the device type but will typically measure tens to hundreds of microns on a side.

Through-silicon vias ("TSVs") are used to connect the bond pads with a second face of the semiconductor chip opposite the first face (e.g., a rear surface). A conventional via includes a hole penetrating through the semiconductor chip and a conductive material extending through the hole from the first face to the second face. The bond pads may be electrically connected to vias to allow communication between the bond pads and conductive elements on the second face of the semiconductor chip.

Current methods of plating conductive traces along the walls of conventional vias, or alternatively trenches formed in the substrate, primarily include photolithography. Photolithography is inefficient and inaccurate when forming conductive traces simultaneously along multiple surfaces that are not parallel with one another. It is cumbersome to develop a mask for use in photolithography that takes into account the surface changes of a substrate, or alternatively, to reposition and reorient the substrate to accommodate its differently-facing surfaces.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in semiconductor via formation and interconnection and plating technology, further improvements can still be made.

BRIEF SUMMARY OF THE INVENTION

A first aspect of the present invention is a method of forming a conductive element on a substrate. The method includes the steps of: (a) providing an assembly including a substrate having a front face, a rear face remote from the front face, and a sloped surface extending from the rear face toward the front face, the substrate including a region of dielectric material at at least the sloped surface, the assembly including a sacrificial layer overlying the dielectric region; (b) forming a groove in at least the sacrificial layer, the groove extending along at least the sloped surface, by removing a portion of the sacrificial layer by a non-photolithographic method; and (c) forming a conductive element having cross-sectional dimensions at least partly defined by the groove.

In accordance with certain embodiments of this first aspect, the conductive element may include a length extending in a first direction along the dielectric region and in a second direction along the dielectric region, the second direction being transverse to the first direction. Step (b) may include forming a groove in the dielectric region by removing at least a portion of the dielectric region directly beneath the portion of the sacrificial layer. The substrate may include a second region underlying the dielectric region and step (b) may further include removing the dielectric region at most to a depth of one half a thickness of the dielectric region above the second region. The second region may consist essentially of monocrystalline semiconductor material, and the dielectric region may include a layer of dielectric material conforming to a contour of a sloped surface of the second region. The substrate may be a microelectronic element having a microelectronic device disposed therein, the microelectronic element having at least one conductive pad at the front face, the conductive element being electrically connected to the at least one pad. Step (c) may further include forming a contact exposed at the rear face of the microelectronic element, the conductive element electrically connecting the at least one conductive pad with the at least one contact. The conductive element may or may not conform to a surface of the groove. The conductive element may be at least partially embedded within the groove in the dielectric region. The conductive element may extend from within the groove in the dielectric region to a height above an exposed surface of the dielectric region.

Step (c) may include forming a catalyst layer overlying the sacrificial layer and an exposed portion of the dielectric region, and then selectively depositing a metal onto an area where the catalyst layer is present to form the conductive element. The method may further include the step of removing the sacrificial layer from the assembly, thereby also removing the catalyst layer disposed on the sacrificial layer. The step of removing the sacrificial layer may be conducted before depositing the metal such that the metal is not deposited onto areas of the sloped surface formerly occupied by a portion of the sacrificial layer on which the catalyst layer is formed. The step of removing the sacrificial layer may be conducted after at least partly depositing the metal. The step of removing the sacrificial layer may be conducted after partly depositing the metal, and step (c) may further include depositing metal selectively onto the partly-deposited metal after the step of removing the sacrificial layer.

Step (b) may include forming at least one additional groove, and step (c) may include forming a conductive element having cross-sectional dimensions at least partly defined by the at least one additional groove. The substrate may include a conductive pad exposed at the front face and a contact exposed at the rear face, the conductive elements each electrically connecting the conductive pad with the contact such that the conductive elements provide parallel electrical connections therebetween. The substrate may include a conductive pad exposed at the front face and a contact exposed at the rear face, wherein the impedance between the conductive pad and the contact is reduced through the parallel electrical connections of the conductive elements.

At least a portion of the sloped surface may be planar and step (b) may include forming the groove in at least the sacrificial layer overlying the planar portion. At least a portion of the sloped surface may be non-planar and step (b) may include forming the groove in at least the sacrificial layer overlying the non-planar portion. At least a portion of the sloped surface may include a concave portion and step (b) may include forming the groove in at least the sacrificial layer overlying the concave portion. The sloped surface may be defined as a surface of revolution about an axis. Step (b) may include forming the groove in a spiral formation about the axis on the surface of revolution. The sloped surface may include a first sloped surface and a second sloped surface extending away from the first sloped surface, wherein the first and second sloped surfaces have different slopes defining a step change in slope at a boundary between the first and second sloped surfaces, and step (b) may include forming the groove such that it extends along the first and second sloped surfaces. The non-photolithographic method may include at least one of: directing a laser toward at least the sloped surface to ablate the portion of the sacrificial layer, mechanical milling, or sandblasting. The step of forming the groove may include positioning a metal stencil to overlie the sacrificial layer, the metal stencil having at least one opening, and removing the portion of the sacrificial layer exposed through the at least one opening by sandblasting. The step of forming the groove may include removing a portion of the sacrificial layer by mechanical milling.

A second aspect of the present invention is a method of forming a conductive element on a substrate. The method includes the steps of: providing a substrate having a front face and a rear face remote from the front face; forming at least one opening extending from the rear face to the front face of the substrate; filling the at least one opening with a dielectric material to form a dielectric layer; forming a sacrificial layer overlying the dielectric layer; removing at least a portion of each of the sacrificial layer and the dielectric layer by a non-photolithographic method to form an aperture within the opening extending in a direction between the top and front faces; forming a catalyst layer on at least a surface interior to the aperture; and forming a conductive element by selectively depositing a metal onto the catalyst layer such that the conductive element extends at least partially through the at least one opening in the substrate.

In accordance with certain embodiments of this second aspect, the method may further include the step of removing the sacrificial layer after at least partly depositing the metal, thereby also removing the catalyst layer disposed on the sacrificial layer. The conductive element may connect the front and rear faces of the substrate. The conductive element may or may not conform to a contour of the at least one opening in the substrate. The non-photolithographic method may include at least one of: directing a laser toward at least the sloped surface to ablate the portion of the sacrificial layer, mechanical milling, or sandblasting. The step of removing may include positioning a metal stencil to overlie the sacrificial layer, the metal stencil having at least one opening, and removing the portion of the sacrificial layer exposed through the at least one opening by sandblasting. The step of removing may include removing at least a portion of each of the sacrificial layer and the dielectric layer by mechanical milling.

A third aspect of the present invention is an assembly including a substrate having a first planar surface, a second planar surface remote from the first planar surface, and a sloped surface extending from the first planar surface toward the second planar surface, the substrate including a region of dielectric material at at least the sloped surface of the substrate; an elongated groove extending along a surface of the dielectric region exposed at at least the sloped surface, the groove having a floor; and a conductive element having cross-sectional dimensions at least partly defined by the groove and extending from the floor of the groove to a height above the surface of the dielectric region, the conductive element having a length along the surface of the dielectric region which is greater than the height, the conductive element at least partially embedded in the groove; wherein the height of the conductive element from the sloped surface is at least substantially the same throughout the length of the conductive element.

In accordance with certain embodiments of this third aspect, at least a portion of the sloped surface may be planar and the conductive element may extend along the planar portion. At least a portion of the sloped surface may be non-planar and the conductive element may extend along the non-planar portion. At least a portion of the sloped surface may be defined as a surface of revolution about an axis and the conductive element may extend along the surface of revolution. The groove may be formed in a spiral formation about the axis on the surface of revolution. At least a portion of the sloped surface may include a concave portion and the conductive element may extend along the concave portion. The groove may extend from at least a first point on the sloped surface to at least a second point on the sloped surface, the groove disposed along a non-linear path having a length with reference to the surface of the dielectric region, the length of the non-linear path being greater than a linear distance with reference to the surface of the dielectric region between the first and second points.

The length of the conductive element may extend in a first direction along the dielectric region and in a second direction along the dielectric region, the second direction transverse to the first direction. The groove may extend from a first point on the sloped surface to a second point on the sloped surface, the groove disposed along a path having a length greater than a shortest distance along the surface of the dielectric region between the first and second points. The conductive element may be partially embedded within the groove of the dielectric region. The floor of the groove may be disposed at a depth of at most half a thickness of the dielectric region.

The groove may be a first groove and the conductive element may be a first conductive element, and the assembly may further include: a second elongated groove extending along the surface of the dielectric region exposed at at least the sloped surface, the second groove having a floor; and a second conductive element having cross-sectional dimensions at least partly defined by the second groove and extending from the floor of the second groove to a second height above the surface of the dielectric region, the second conductive element having a length along the surface of the dielectric region which is greater than the second height; wherein the second height of the second conductive element from the sloped surface is at least substantially the same throughout the length of the second conductive element.

The substrate may include a conductive pad exposed at the front face and a contact exposed at the rear face, each of the first and second conductive elements electrically connecting the conductive pad with the contact such that the first and second conductive elements provide parallel electrical connections therebetween. The substrate may include a conductive pad exposed at the front face and a contact exposed at the rear face, wherein the impedance between the conductive pad and the contact is reduced through the parallel electrical connections of the first and second conductive elements.

The assembly may further include a conductive via extending from the second planar surface through the substrate, wherein the conductive element is connected at one end to the conductive via and extending therefrom along the sloped surface toward the first planar surface. The assembly may further include a conductive pad exposed at the second planar surface and overlying the conductive via. The conductive element may extend onto the first planar surface of the substrate and may be electrically connected at one end to a terminal overlying the first planar surface. The sloped surface may include a first sloped surface and a second sloped surface extending away from the first sloped surface, wherein the first and second sloped surfaces have different slopes defining a step change in slope at a boundary between the first and second sloped surfaces, and the groove extends along the first and second sloped surfaces.

The substrate may be a microelectronic element having a microelectronic device disposed therein, the microelectronic element having at least one conductive pad at the front face, the conductive element being electrically connected to the at least one pad. A contact may be exposed at the rear face of the microelectronic element, the conductive element electrically connecting the at least one conductive pad with the at least one contact. The conductive element may or may not conform to a surface of the groove.

The substrate may include a second region consisting essentially of monocrystalline semiconductor material, the dielectric region overlying the second region, wherein the groove extends in a direction along a surface of the second region. The substrate may consist essentially of dielectric material. The substrate may include a second region consisting essentially of conductive material, the dielectric region overlying the second region, wherein the groove extends in a direction along a surface of the second region.

A fourth aspect of the present invention is a system including an assembly as described above and one or more other electronic components electrically connected to the assembly. In accordance with certain embodiments of this fourth aspect, the system may further include a housing, the assembly and the other electronic components being mounted to the housing.

Further aspects of the invention provide systems which incorporate microelectronic structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

DETAILED DESCRIPTION

As used in this disclosure, a statement that an electrically conductive element is "exposed at" a surface of a dielectric element indicates that the electrically conductive element is available for contact with a theoretical point moving in a direction perpendicular to the surface of the dielectric element toward the surface of the dielectric element from outside the dielectric element. Thus, a terminal or other conductive element which is exposed at a surface of a dielectric element may project from such surface; may be flush with such surface; or may be recessed relative to such surface and exposed through a hole or depression in the dielectric.

Figure 1:
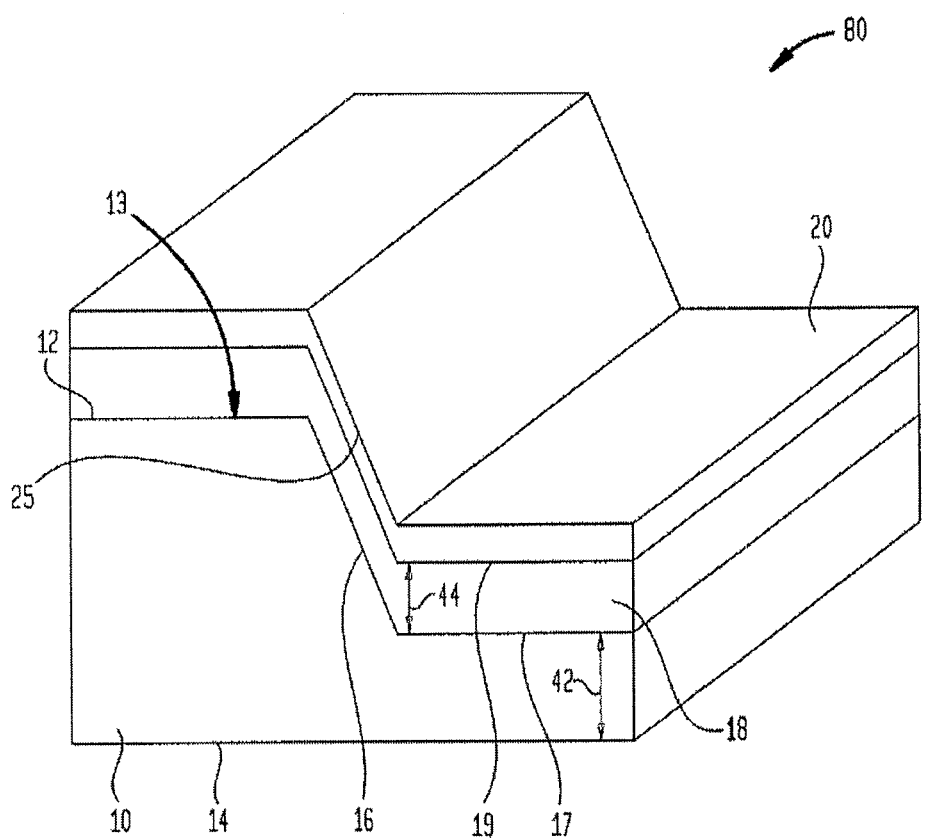
FIGS. 1-5 are front perspective views of an assembly showing various steps of making a structure in accordance with the present invention.
Figure 2:
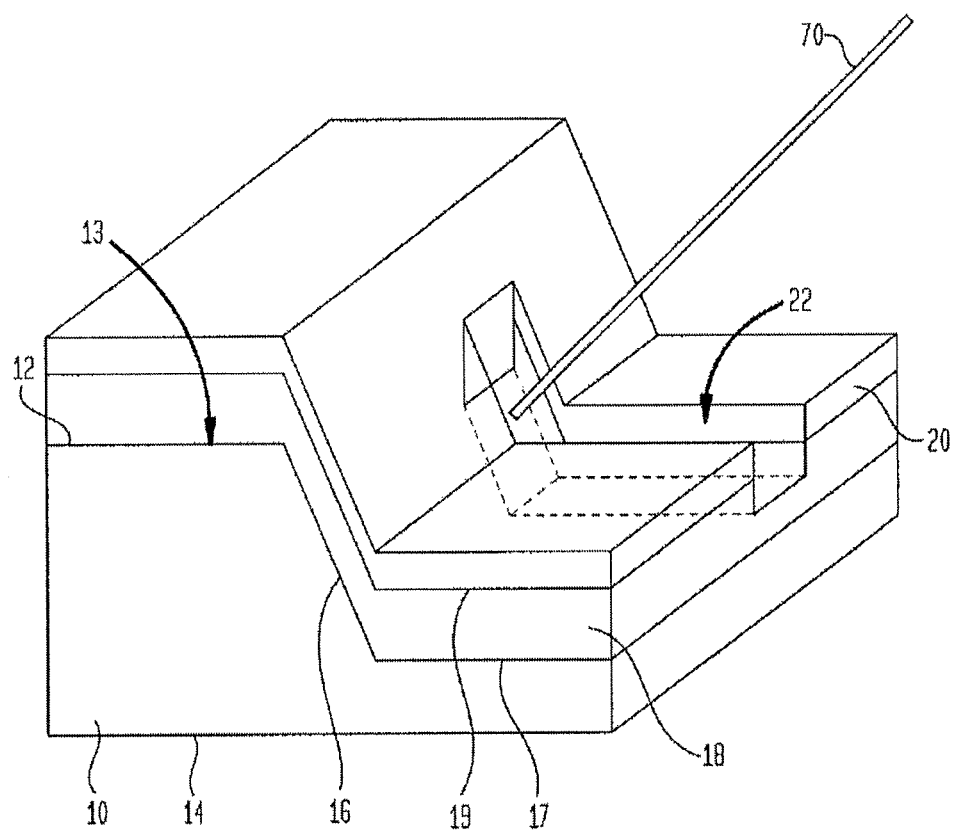
Figure 3:
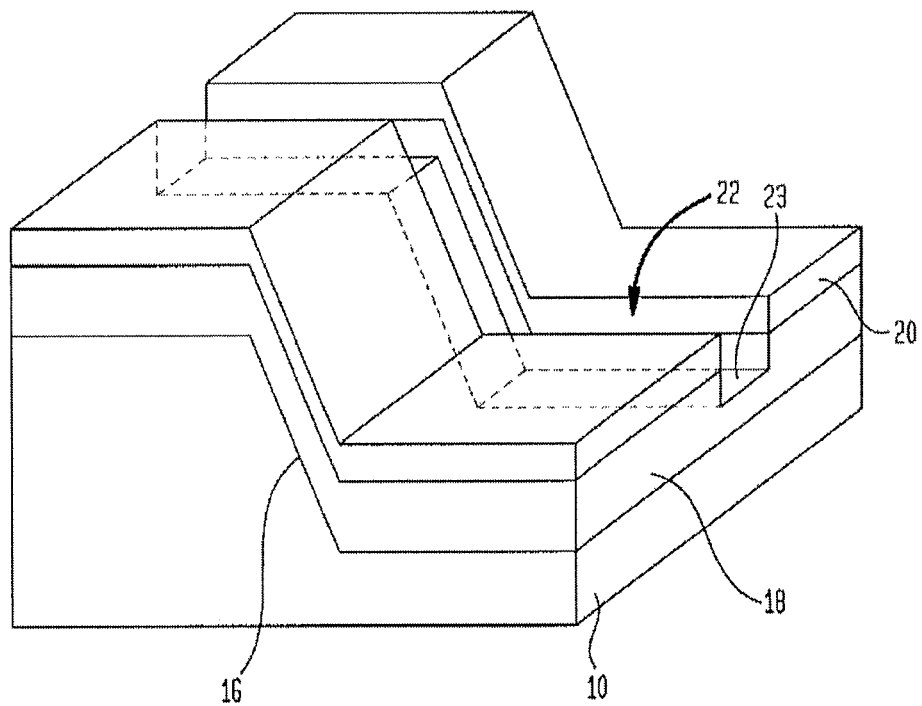
Figure 6:
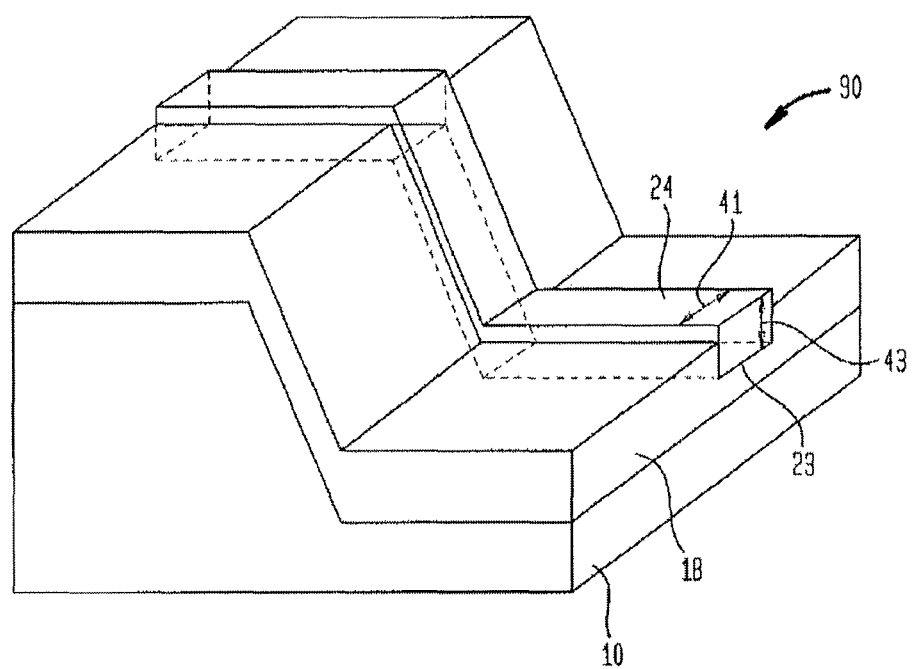
FIG. 6 is a front perspective view of a structure resulting from the assembly of FIGS. 1-5.

A first embodiment of a semiconductor element 90, shown in FIG. 6, will be herein described according to its method of construction. An assembly 80 is shown in FIG. 1 having a substrate 10 with a rear face 12 and a front face 14. The substrate typically consists essentially of a monocrystalline semiconductor material such as, for example, silicon, an alloy of silicon with another material, one or more III-V semiconductor compounds such as gallium arsenide among others, or one or more II-VI semiconductor compounds. In a particular embodiment, the substrate can be a silicon-on-insulator substrate which includes a buried oxide ("BOX") layer that separates an active semiconductor device layer at front face 14 from a bulk semiconductor region at rear face 12. A sloped surface 16 extends from rear face 12 toward front face 14, and a trench surface 17 extends from sloped surface 16. Rear face 12, sloped surface 16, and trench surface 17 will be referred to herein collectively as lower face 13. As described further below with reference to FIGS. 6-8, trench surface 17 may be an interior surface within a trench which is defined as trench surface 17, surface 16, and an additional sloped surface or other surface extending away from trench surface 17 towards rear surface 12. A thickness 42 of the semiconductor element between the front surface 14 and the trench surface 17 typically is less than 200 microns and may be significantly smaller, i.e., only a few microns or tens of microns.

In the embodiment shown in FIGS. 1-6, sloped surface 16 forms a portion of a trench in lower face 13, although only part of the trench is depicted. It is noted that substrate 10 is shown in FIGS. 1-6 in one configuration for purposes of describing the following method of constructing assembly 80, although other configurations of assembly 80 and substrate 10 may be realized by the present invention and will be described more thoroughly below. For example, substrate 10 can include a trench that is symmetrical or asymmetrical about a vertical axis, or substrate 10 can include a frusto-conical or cylindrical hole.

As seen in FIG. 1, a region 18 of dielectric material is provided overlying lower face 13 at least sloped surface 16, and sacrificial layer 20 overlies a top surface 19 of the dielectric region 18. The thicknesses of each of dielectric region 18 and sacrificial layer 20 typically are substantially constant along lower face 13 despite its changing contours. The sacrificial layer typically is a polymeric material and typically has an exposed surface 25 which conforms to a contour of top surface 19 of dielectric region 18 on which it is provided. The sacrificial layer can be applied to surface 19 of the dielectric region overlying lower face 13 of the assembly, such as, for example, by spray-coating, spin-coating, dipping, or other method. In a particular embodiment, the sacrificial layer is removable by chemical means, such as by using an etchant. In one embodiment, the sacrificial layer is removable by peeling. As shown in FIGS. 2-5, a groove 22 is formed in at least sacrificial layer 20 and may also extend somewhat into the thickness of dielectric region 18. Groove 22 extends along sloped surface 16 and may also extend along a portion of rear face 12, a portion of trench surface 17, or both. Groove 22 can be formed through the use of a laser 70 directed at lower face 13 of assembly 80. Laser 70 ablates or otherwise removes a portion of sacrificial layer 20, and may also remove a portion of dielectric region 18 aligned therewith. Groove 22 is displayed as being generally rectangular in cross-section, though other cross-sections may be formed either purposefully or as a result of the constraints of using laser 70. The portion of groove 22, when formed in dielectric region 18, is disposed in alignment with the groove formed in sacrificial layer 20 such that the groove in the dielectric region typically is formed in locations where the laser ablates through the full thickness of the sacrificial layer. The depth of the groove 22 into dielectric region 18 typically is less than about half the thickness 44 of the dielectric region 18, as measured, for example, between surface 17 of the substrate 10 and top surface 19 of dielectric region 18. In one example, a thickness of the dielectric region can range between 0.5 micron and several tens of microns.

Figure 4:
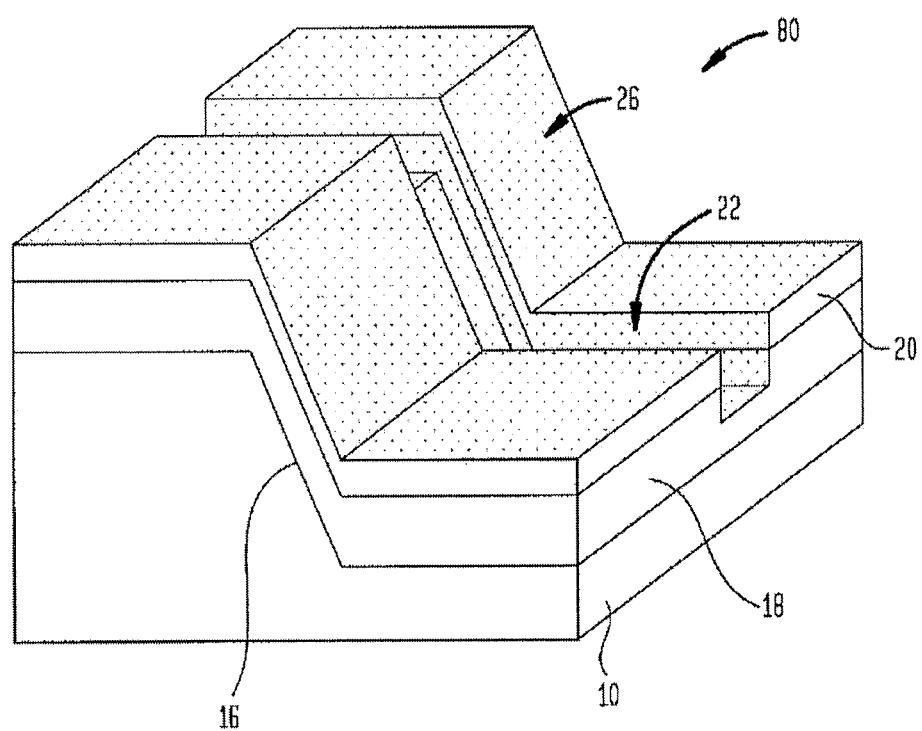

As shown in FIG. 4, a catalyst layer 26 is formed overlying the exposed portions of sacrificial layer 20 and dielectric region 18. Catalyst layer 26 typically is a thin layer of metal particles which can catalyze a subsequent metal deposition process, for example, a subsequent aqueous deposition process used in plating metal layers thereon. In one example, the catalyst layer can include platinum particles. In one example, the catalyst layer can be formed by providing a liquid containing the catalyst particles to the exposed surfaces of the sacrificial layer 20, for example, by dipping the substrate in a bath containing the catalyst particles. The catalyst layer 26 typically uniformly coats assembly 80 at sacrificial layer 20, at dielectric region 18, and in groove 22, but does not substantially "fill" groove 22. A conductive element 24, shown in FIG. 6, is then formed in groove 22 through a process of metal deposition.

Figure 5:
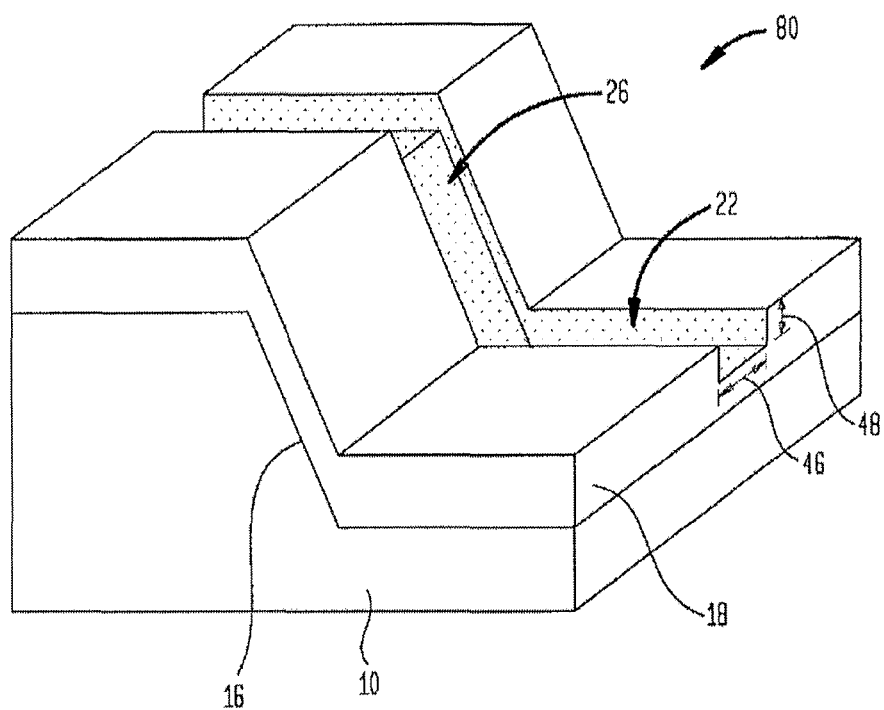

In one embodiment, as shown in FIG. 5, sacrificial layer 20 is removed from assembly 80, thereby also removing catalyst layer 26 disposed on sacrificial layer 20. Catalyst layer 26 is therefore disposed only in groove 22 after sacrificial layer 20 has been removed. A seed layer can then be selectively deposited onto the catalyst layer, and the process can continue with the deposition of one or more metal layers, which can include any of or all of an adhesion layer, a barrier metal layer, and a primary metal layer to produce a conductive element 24 as seen in FIG. 6. Typically, such seed layer, adhesion layer, barrier metal layer or primary metal layer is deposited by plating. As seen in FIG. 6, cross-sectional dimensions of the conductive element 24, i.e., a width 41, and a height or thickness 43 of the conductive element above a floor 23 of the groove are at least partly defined by the groove 22, that is, by corresponding cross-sectional dimensions 46, 48 of the groove 22 (FIG. 5). In this way, conductive element 24 can have a contour which conforms to the inner surface of groove 22 and is at least partially embedded within groove 22 in dielectric region 18. In one embodiment, as seen in FIG. 6, conductive element 24 can extend from within groove 22 in dielectric region 18 to a height above top surface 19 of dielectric region 18.

In a variation of the above-described embodiment, the sacrificial layer 20 can be removed after one or more or the metal layers is deposited which make up the conductive element 24. For example, in one embodiment, sacrificial layer 20 can be removed after depositing any or all of a seed layer, an adhesion layer, a barrier metal layer or other metal layer provided before the primary metal layer is deposited. In such case, the sacrificial layer may be removed in a "lift-off" process from the dielectric region, such as by etching, peeling or other method. Then, after removing the sacrificial layer 20, the metal deposition can continue with the deposition of one or more subsequent metal layers including the primary metal layer to form conductive element 24.

FIG. 6 shows a structure 90 that results once sacrificial layer 20 has been removed from assembly 80 and conductive element 24 is fully formed. Structure 90 includes substrate 10 having sloped surface 16, dielectric region 18 overlying lower face 13 of substrate 10, groove 22 formed in dielectric region 18 and exposed at at least sloped surface 18, and conductive element 24 disposed in groove 22. As noted above, groove 22 at least partly defines the cross-sectional dimensions 41, 43 of conductive element 24, which may extend from a floor 23 (FIG. 3) of groove 22 to a height above top surface 19 of dielectric region 18. Conductive element 24 typically has a length extending in a direction along top surface 19 of dielectric region 18, the length extending in a direction transverse to its cross-sectional. In one embodiment, the height of conductive element 24 from sloped surface 16 is at least substantially the same throughout the length of conductive element 24.

A variation of the above embodiment can be used to form a structure in which a conductive element extends along a sloped surface or other surfaces of a substrate which consists essentially of dielectric material. In such variation, the assembly shown in FIG. 1 can include a dielectric region instead of the semiconductor substrate 10 and dielectric layer 18. The dielectric region typically includes one or more dielectric materials such as silicon dioxide in any form, other dielectric compound of silicon, or other inorganic dielectric material, such as a ceramic material, among others. Then, the processing described above with respect to FIGS. 2-6 can be applied to form a structure having a conductive element 24 extending along surfaces of the dielectric region 18.

Figure 7:
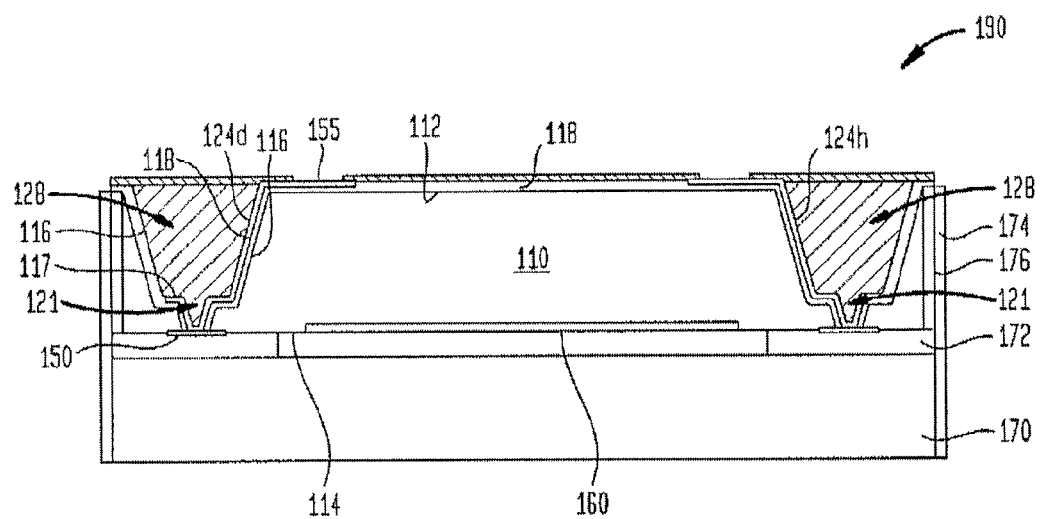
FIG. 7 is a sectional view taken along line 7-7 of FIG. 8 of another embodiment of an assembly in accordance with the present invention.
Figure 8:
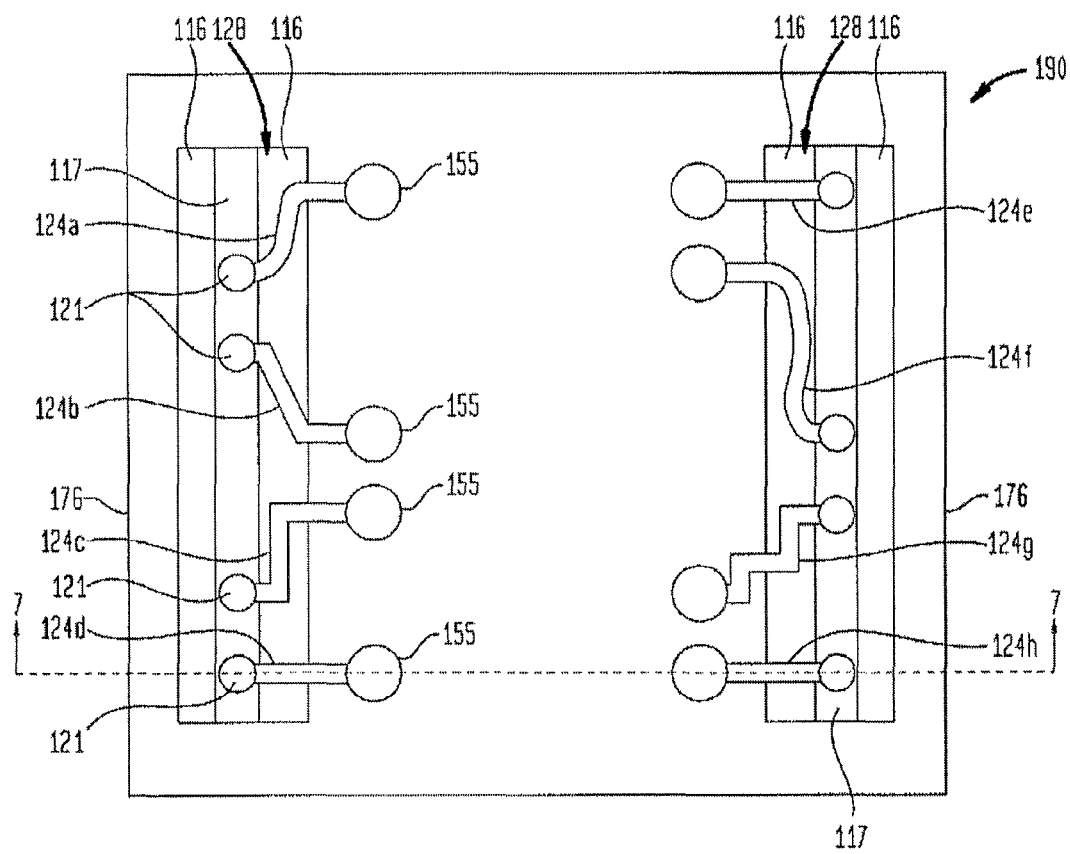
FIG. 8 is a top plan view of the assembly of FIG. 7.

A second embodiment of an assembly is shown in FIGS. 7 and 8. Assembly 190 includes similar components to those described above, namely a substrate 110 with a rear face 112 and a front face 114. The substrate 110 can be a semiconductor element, such as can include microelectronic devices therein, such as in a microelectronic device region 160 adjacent the front face 114. Trenches 128 are formed in substrate 110 and are each defined by a trench surface 117 and sloped surfaces 116 extending from rear face 112 toward front face 114. Trenches 128 extend through much of the thickness of substrate 110 measured between rear face 112 and front face 114, and vias 121 extend from within the trenches 128 to contacts 155 at rear face 112. As seen in FIGS. 7-8, the trenches 128 are disposed adjacent peripheral edges 176 of the substrate 110 and can extend in directions parallel thereto.

Trenches 128 can alternatively be provided in the form of holes overlying individual ones of the vias 121, or in the form of channels extending over a row or rows of bond pads of each individual substrate 110, or in the form of channels which extend the length of a wafer which includes a plurality of substrates 110. As further shown in FIG. 7, assembly 190 includes a lid 170 which can be mounted above the device region 160, such as via an adhesive or other material 172 between front face 114 and the lid. In operation, the lid can be at least partially transparent to wavelengths or frequencies of radiation of interest to operation of the microelectronic devices 160. For example, the microelectronic devices can include an image sensor, in which case, the lid 170 can be at least partially transparent to wavelengths of light or other radiation to be received by the image sensor. In one example, the lid can be made of optically transparent material, such as glass, quartz, or a polymeric material. For other types of microelectronic devices such as micro-electromechanical systems ("MEMs") devices, surface acoustic wave ("SAW") filters, and accelerometers, for example, which operate within sealed cavities, the assembly can be hermetically sealed, such as by using a continuous layer of metal 174 extending around a periphery of the assembly 190, the metal being insulated from the substrate 110 by a layer of dielectric material 176. The adhesive typically has an insulating function. As particularly illustrated in FIG. 7, the adhesive 172 can be aligned with the conductive pads 150 of the microelectronic substrate so as to insulate individual ones of the conductive pads 150 from one another.

As shown in FIG. 8, a plurality of conductive traces 124a, 124b, 124c, 124d, 124e, 124f, 124g, and 124h extend along sloped surfaces 116 and electrically connect conductive pads 150 at front face 114 with contacts 155 at rear face 112. The conductive traces can be formed in the same manner as the conductive elements are formed in the embodiment described above with respect to FIGS. 1-6. The conductive elements in FIGS. 7-8 may take on a variety of orientations. For instance, Conductive elements 124a and 124f are non-linear with respect to sloped surface 116. Conductive trace 124b is oriented along a diagonal with respect to the direction between front face 114 and rear face 112. Conductive elements 124c and 124g have lengths extending in a first direction along a dielectric region 118 and in a second direction along dielectric region 118, the second direction being transverse to the first direction. Conductive elements 124c and 124g are made up of linear segments connected to one another. The conductive traces 124a-h depict some of the many orientations that conductive traces according to the present invention may have. The ability to employ a laser during creating of conductive traces make such orientations possible to be manufactured in an efficient and economical way.

Moreover, the use of a laser to form conductive traces as an alternative to photolithography may permit the layout of the traces to be changed more easily. With the present method, changing the layout may only require a change to a computer program which controls the movement of the laser, since the laser's movement determines the shape and dimensions of the conductive traces 124a-h. This contrasts with the time and expense required to create and verify a photomask used to form traces by photolithography.

Figure 9:
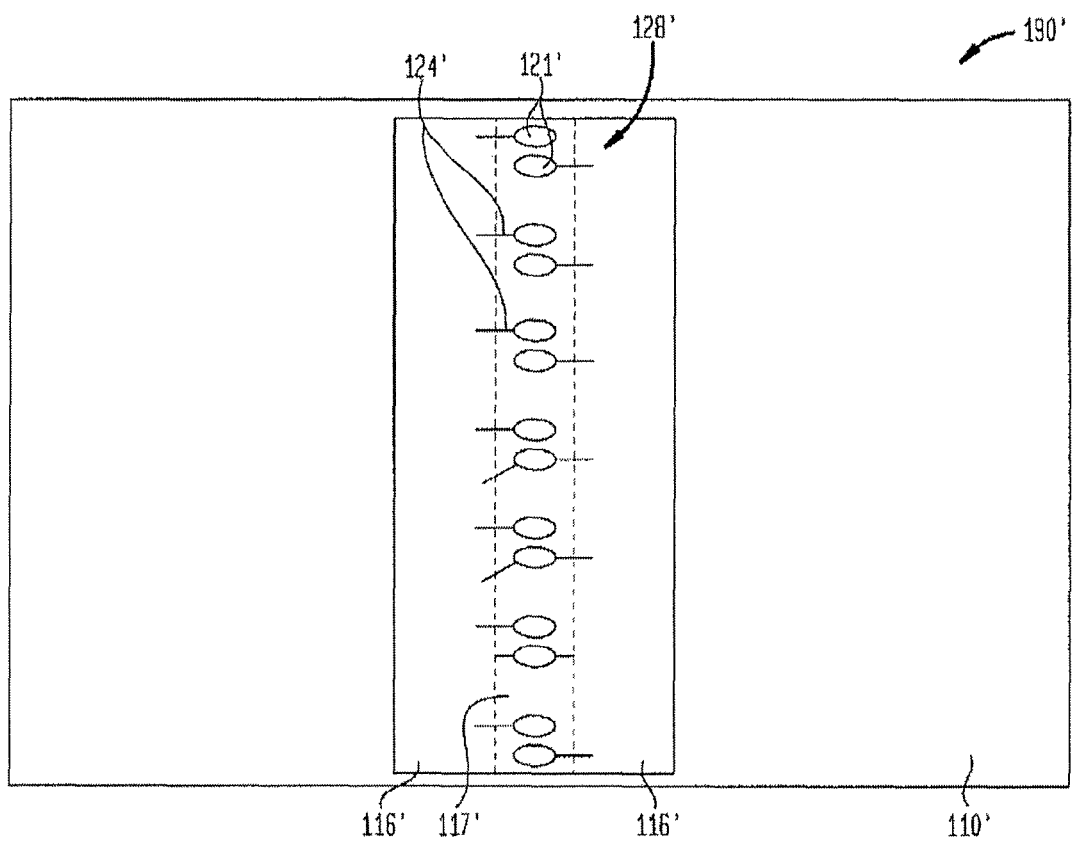
FIG. 9 is a top plan view of a variation of the embodiment of FIGS. 7 and 8.

An alternative to the second embodiment is shown in the plan view of FIG. 9, where assembly 190' includes a trench 128' disposed in the middle portion of substrate 110'. Trench 128' is defined by sloped surfaces 116' and trench surface 117', and includes vias 121'. Conductive elements 124' connected to vias 121' extend away from the vias along inner surfaces of the trench, as described above with respect to FIGS. 7-8. In one example, semiconductor element 190' may be an integrated circuit chip which includes a dynamic random access memory ("DRAM"), i.e., a DRAM chip.

Figure 10:
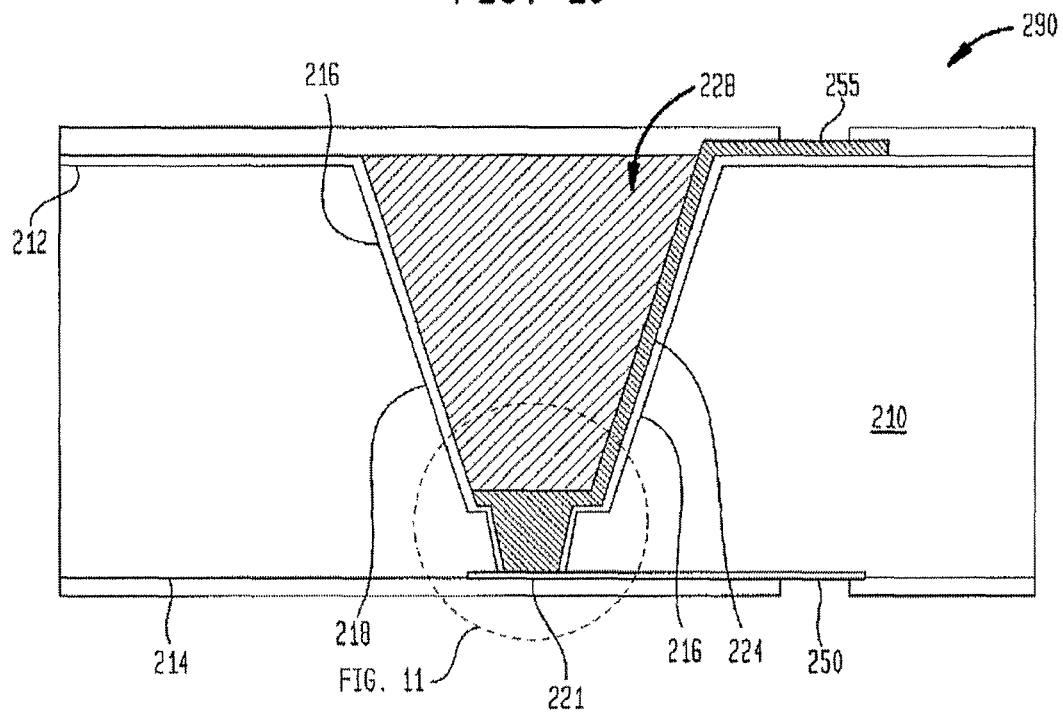
FIGS. 10 and 11 are sectional views of another embodiment of an assembly in accordance with the present invention.
Figure 11:
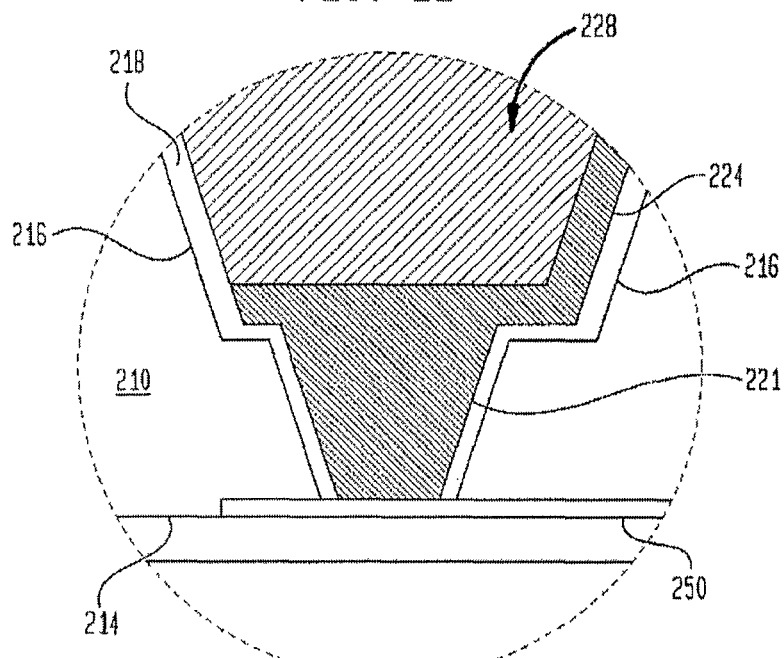

An assembly 290 according to a third embodiment is shown in FIGS. 10 and 11. Assembly 290 can include similar components to those described above, namely a substrate 210 with a rear face 212 and a front face 214. Substrate 210 further includes sloped surfaces 216 that extend from rear face 212 toward front face 214. A dielectric region 218 is provided overlying at least sloped surface 216. A conductive region overlies at least the rear face 112 and sloped surfaces 216. Vias 221 can extend from within the trenches 228 to contacts 255 at rear face 212, which in the example of FIGS. 10 and 11 are filled with conductive material. A conductive trace 224 can extend along sloped surface 216 and electrically connects a conductive pad 250 at front face 214 with a contact 255 at rear face 212. Conductive elements 224 can extend from individual ones of the vias 221 upwardly along sloped surface 216 that may be shared by several vias. Multiple conductive traces 224 may extend between pad 250 and contact 255 and may extend along different sloped surfaces 216. In that regard, substrate 210 can be constructed in substantially the same manner as described above, including the formation of grooves that extend along two or more differently sloped surfaces 216.

Figure 11A:
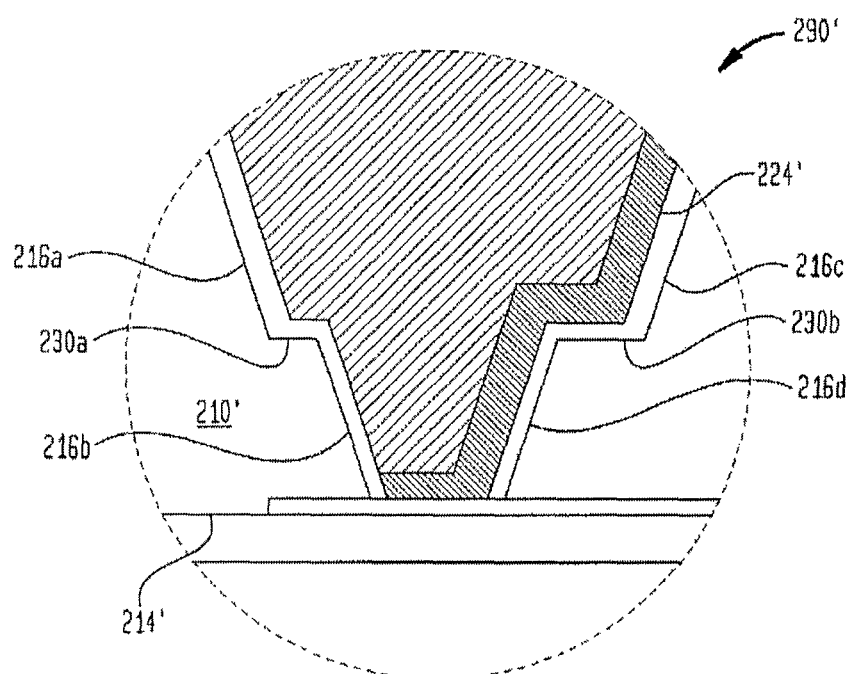
FIG. 11A is a sectional view of a variation of the embodiment of FIGS. 10 and 11.

In an alternative to the third embodiment shown in FIGS. 10 and 11, FIG. 11A depicts a semiconductor element 290' includes a substrate 210' with a front face 214', a rear face 212' (not shown), and sloped surfaces 216a, 216b, 216c, and 216d. Sloped surfaces 216a and 216c each extend from rear face 212' and terminate at a median surface 230a and 230b, respectively, which in turn terminate at sloped surfaces 216b and 216d, respectively. Sloped surfaces 216b and 216d may or may not be disposed at the same angles, or slopes, as sloped surfaces 216a and 216c with respect to the height of substrate 210' between rear face 212' and front face 214', thereby defining a potential step change between sloped surfaces 216a and 216b, and between sloped surfaces 216c and 216d. Median surfaces 230a and 230b are shown as a boundary between respective sloped surfaces 216a-d, and are preferably planar and parallel to the front face 214', though they may be angled with respect to same. In alternative embodiments, median surfaces 230a and 230b may not be present, such that respective sloped surfaces 216a-d that represent different slopes may extend directly from one another.

Figure 12:
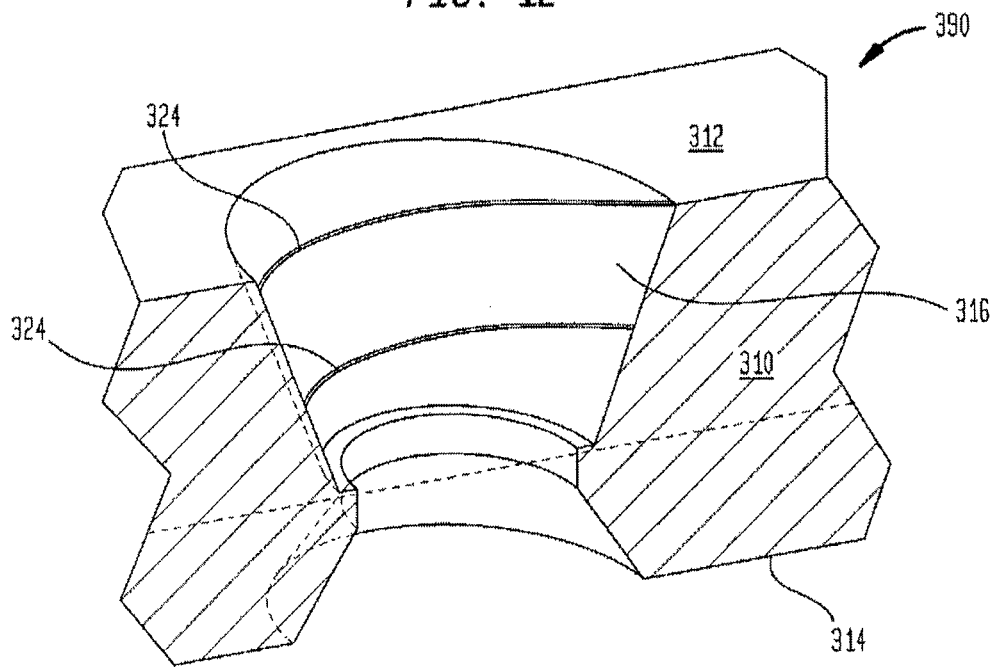
FIG. 12 is a front perspective view of a further embodiment of an assembly in accordance with the present invention.
Figure 13:
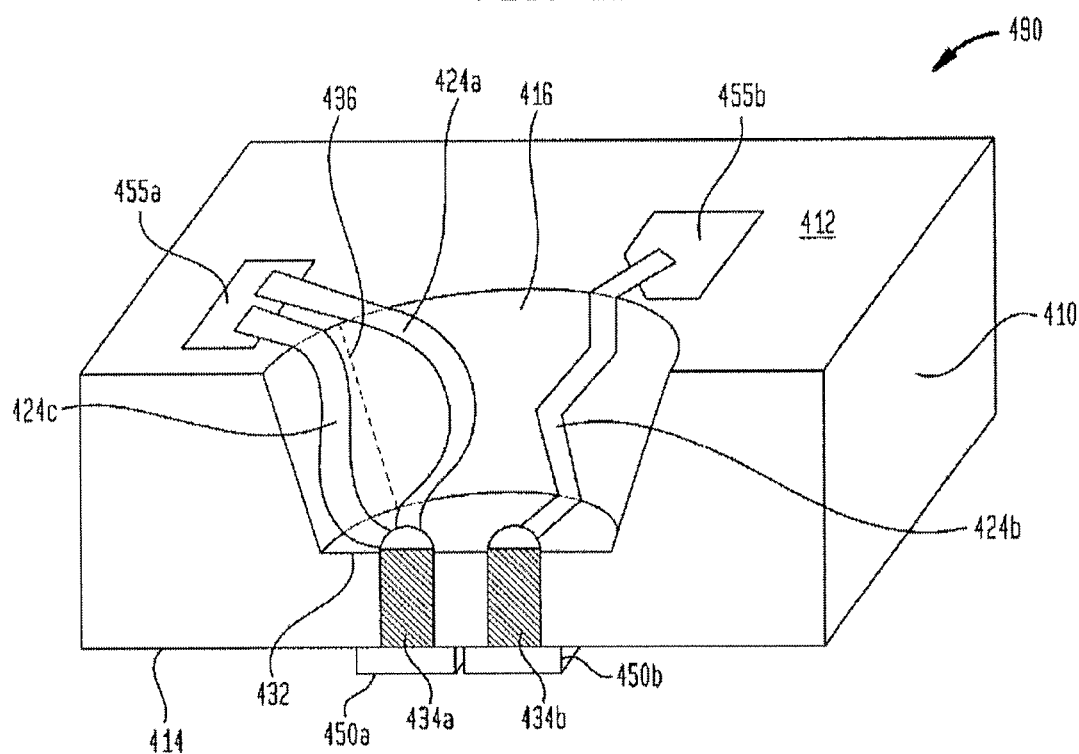
FIG. 13 is a front perspective view of yet another embodiment of an assembly in accordance with the present invention.

A sloped surface, as found in the various embodiments described herein, can take on any number of orientations. A sloped surface can be planar or non-planar. As shown in FIGS. 12 and 13, the non-planar sloped surface can be defined as a surface of revolution about an axis. FIG. 12 shows an assembly 390 according to a fourth embodiment, which includes similar components to those described above. A substrate 310 such as described above can have a first face 312, a second face 314 opposite thereto, and a sloped surface 316 that is defined by a surface of revolution about an axis. Either the first or the second face can be the front face of the substrate. A conductive element 324 such as described above with reference to FIGS. 1-6 can be formed on sloped surface 316 in a spiral formation about the axis defining the surface of revolution.

FIG. 13 shows a fifth embodiment of an assembly 490 having similar components to those described above. A substrate 410 includes a rear face 412, a front face 414, and an opening having a sloped surface 416. As in FIG. 12, in one example, the sloped surface can also be defined by a surface of revolution about an axis. The opening may have an interior surface 432 that extends from sloped surface 416. As seen in FIG. 13, two conductive vias 434a and 434b extend between surface 432 and front face 414. Conductive elements 424a and 424b, formed as described above relative to FIGS. 1-6, are shown extending from rear face 412 along sloped surface 416 and surface 432 and connected to vias 434a and 434b, respectively. Each conductive element 424a and 424b is electrically connected to a terminal or contact 455a and 455b, respectively, overlying rear face 412. A third conductive element 424c is electrically connected to via 434a and contact 455a, and extends in parallel with conductive element 424a. The parallel nature of conductive elements 424a and 424c reduces the impedance between via 434a and 455a to about half of the impedance that would exist if only one such conductive element 424a or 424c were present. Conductive pads 450a and 450b are disposed on front face 414 overlying vias 434a and 434b, respectively.

As shown in FIG. 13, conductive element 424a is formed extending from at least a first point on the sloped surface proximate rear face 412 to at least a second point on the sloped surface proximate surface 432. Conductive element 424a is disposed along a non-linear path having a length with reference to the surface of sloped surface 416, and more accurately, a dielectric region 418 disposed thereon, such that the length of the non-linear path is greater than a linear distance represented by dashed line 436 with reference to the surface of dielectric region 418 between the first and second points. The linear distance represented by dashed line 436 is also the shortest distance along dielectric region 418 between the first and second points.

The vias and via conductors can be formed by processes such as those disclosed in greater detail in the co-pending, commonly assigned US patent applications entitled "MICROELECTRONIC ELEMENTS HAVING METALLIC PADS OVERLYING VIAS," "MICROELECTRONIC ELEMENTS WITH REAR CONTACTS CONNECTED WITH VIA FIRST OR VIA MIDDLE STRUCTURES," "METHOD OF FORMING SEMICONDUCTOR ELEMENTS USING MICRO-ABRASIVE PARTICLE STREAM," "ACTIVE CHIP ON CARRIER OR LAMINATED CHIP HAVING MICROELECTRONIC ELEMENT EMBEDDED THEREIN," and "MICROELECTRONIC ELEMENTS WITH POST-ASSEMBLY PLANARIZATION" filed of even date herewith, and in published US Patent Application Publication No. 20080246136, the disclosures of which are incorporated by reference herein.

Figure 14:
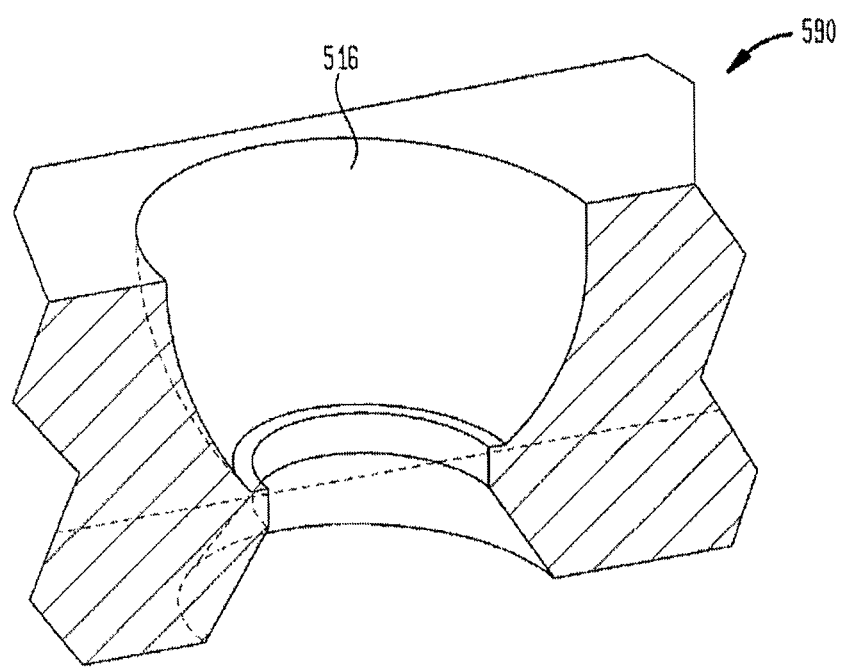
FIG. 14 is a front perspective view of another embodiment of an assembly in accordance with the present invention.
Figure 15:
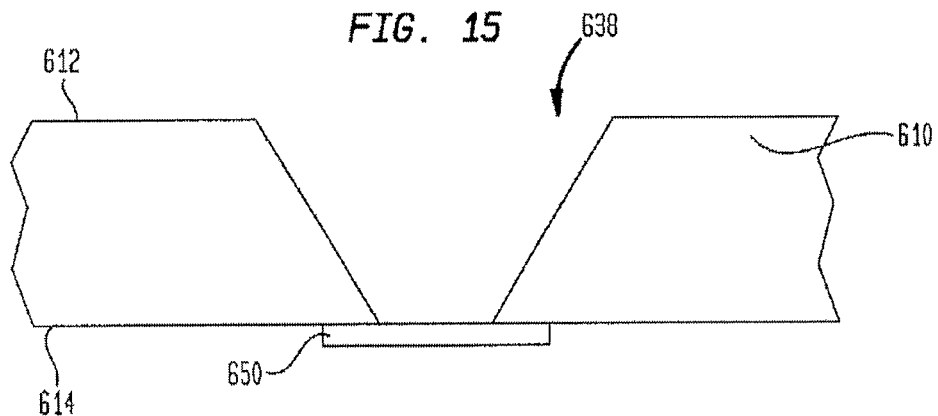
FIGS. 15-19 are front sectional views of an assembly showing various steps of another embodiment of making a structure in accordance with the present invention.

In alternate embodiments, a non-planar sloped surface may be at least partially concave, as shown in FIG. 14, which shows a sixth embodiment of a semiconductor element 590 having concave sloped surface 516. Of course many other configurations of a sloped surface are within the scope of the present invention, though the above-described surfaces are believed to suffice for the purposes of the disclosure.

In certain embodiments of the present invention, a substrate consists essentially of monocrystalline semiconductor material, and a dielectric region overlying the substrate includes a layer of dielectric material conforming to a contour of a sloped surface of the substrate. In alternative embodiments, the substrate may consist essentially of dielectric material, or may include a region consisting essentially of conductive material with a dielectric region overlying the region of conductive material.

Another method of forming a conductive element on a substrate according to the present invention is described with respect to FIGS. 15-20. A substrate 610 includes a rear face 612 and a front face 614. An opening 638 is formed extending from rear face 612 to front face 614, and opening 638 is filled with a dielectric material to form a dielectric layer 618. A conductive pad 650 may overlie opening 638 at front face 614.

Figure 16:
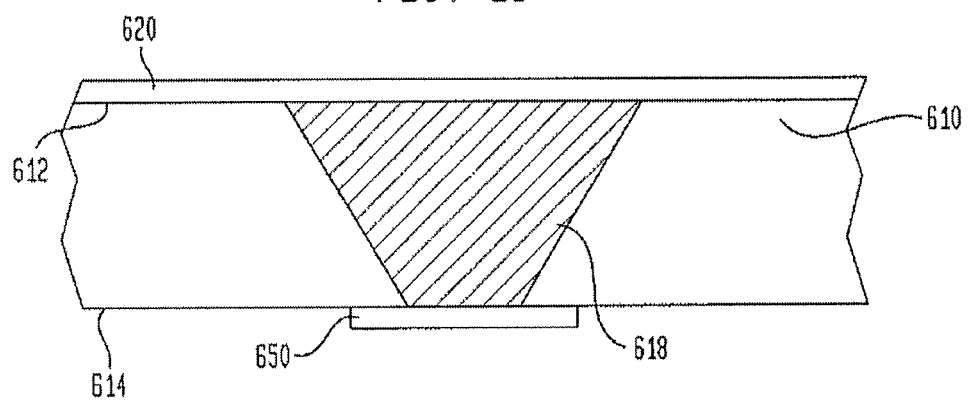
Figure 18:
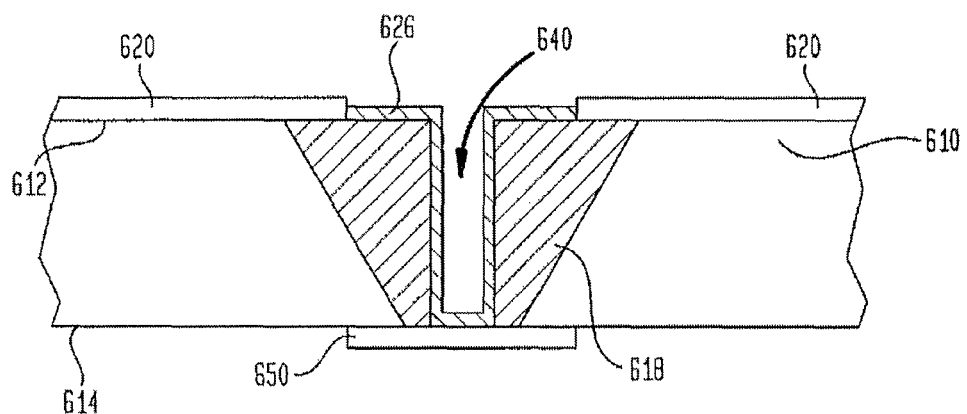
Figure 19:
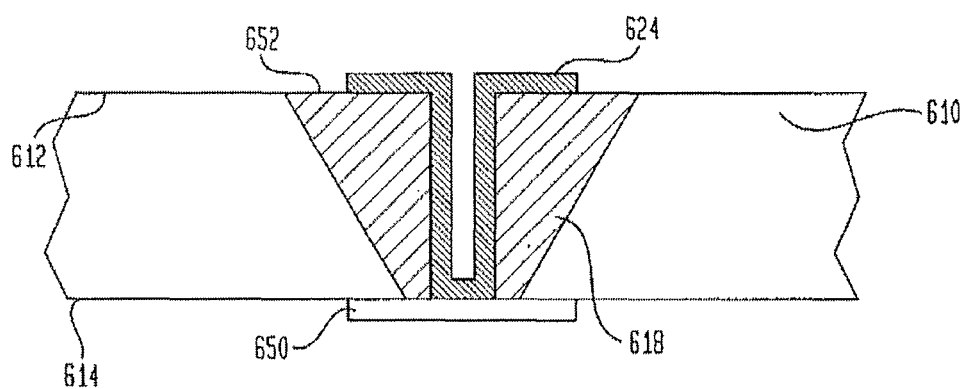
Figure 20:
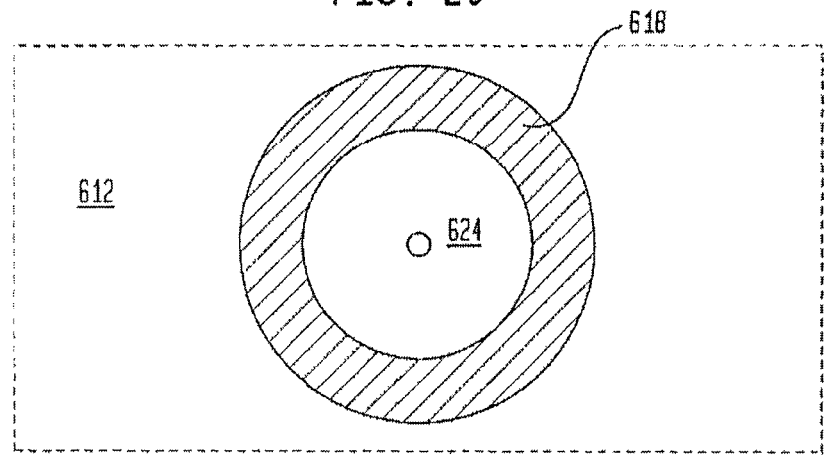
FIG. 20 is a top plan view of the embodiment of FIG. 19.

A sacrificial layer 620 is formed overlying dielectric layer 618, as shown in FIG. 16. Next, at least a portion of each of sacrificial layer 620 and dielectric layer 618 are ablated, preferably by a laser, to form an aperture 640 within opening 638 and to remove an annular portion of sacrificial layer 620 about aperture 640 at rear face 612. Aperture 640 extends in a direction between rear face 612 and front face 614. Aperture can extend through substrate 610 to front face 614, or may be configured to extend to any length toward but not reaching front face 614. A catalyst layer 626, shown in FIG. 18, is then disposed on the exposed portion of dielectric layer 618, including at least the surface interior to aperture 640, as described above (FIGS. 1-6). A conductive element 624 is then formed by selectively depositing a metal onto catalyst layer 626 such that conductive element 624 extends at least partially through opening 638 in substrate 610. As shown in FIGS. 19 and 20, conductive element 624 preferably extends from front face 614 to rear face 612 of substrate, and radially along a surface 652 of dielectric layer 618 at rear face 612.

Figure 17:
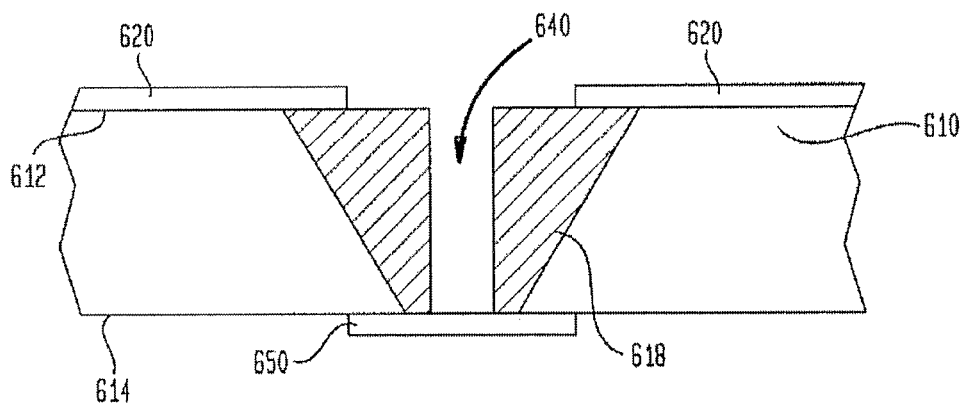

Additional embodiments can be constructed including more than one opening 638. Further, the method may include the step of removing sacrificial layer 620 after one or more metal deposition processes, i.e., the deposition of one or more of a seed layer, an adhesion layer or barrier metal layer as described above, thereby also removing catalyst layer 626 disposed on sacrificial layer 620. As shown in FIG. 17, conductive element 624 connects front face 614 with rear face 612 of substrate 610 and conforms to a contour of opening 638. Alternatively, the conductive element may be a filled structure exposed at surface 652 of the dielectric layer 618. In a further example, a conductive pad (not shown) can overlie at least a part of surface 652 of dielectric layer 618 in contact with the conductive element 624.

Figure 21:
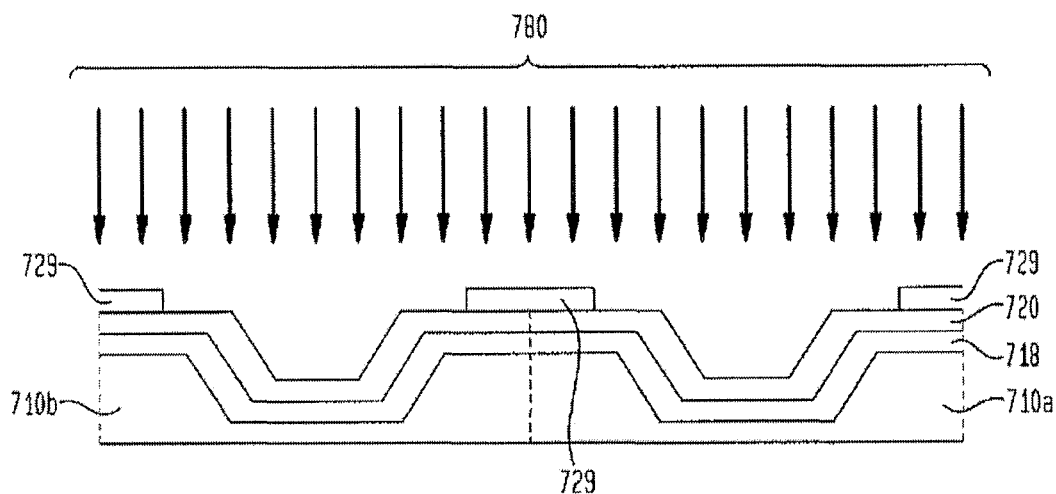
FIG. 21 is a sectional view taken along line 21-21 of FIG. 22 of another embodiment of an assembly having a metal stencil in accordance with the present invention.
Figure 22:
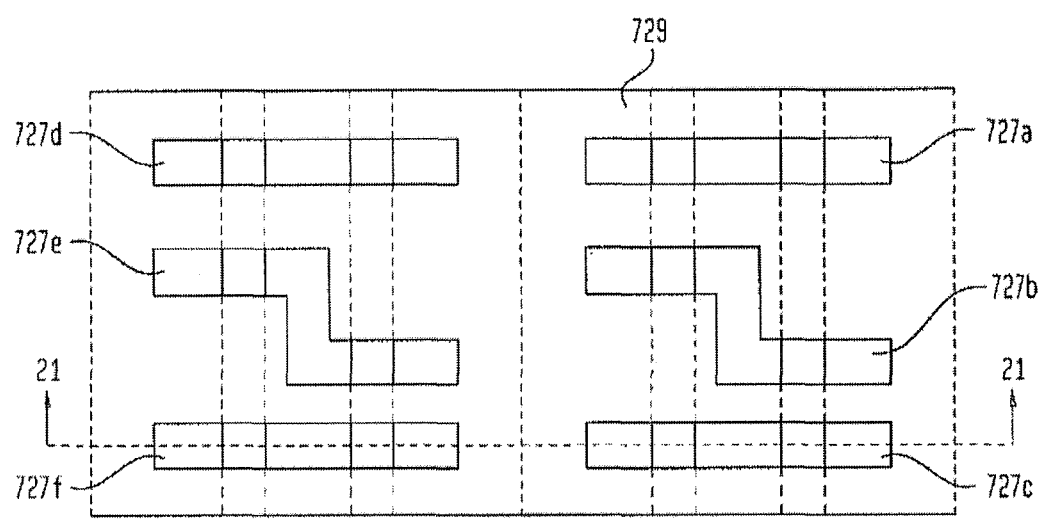
FIG. 22 is a top plan view of the assembly of FIG. 21.

The embodiments described above include grooves and apertures formed by a non-photolithographic method, namely a laser. However, other non-photolithographic methods can be used to form such features according to the present invention. Mechanical milling can be utilized, wherein a small diameter element, which can be referred to as a hammer, repeatedly strikes the sacrificial layer and the dielectric region to loosen and remove such material to form a groove or aperture. Another non-photolithographic method that can be utilized is a sandblasting technique together with a metal stencil 729, as shown in FIGS. 21 and 22. A wafer including substrates 710*a* and 710*b* includes a dielectric region 718 overlying substrates 710*a* and 710*b*, and a sacrificial layer 720 overlying dielectric region 718. A metal stencil 729 is positioned to overlie sacrificial layer 720, and includes openings 727*a-f* which are shaped in accordance with a desired final pattern of conductive elements. A sandblasting technique is employed by directing a sand-based material at the wafer in a direction 780 shown in FIG. 21. The sand-based material will strike sacrificial layer 720 and dielectric region 718 in the areas exposed through openings 727*a-f*, thereby causing grooves to form in substrates 710*a* and 710*b*. The remaining steps of the method of constructing a structure in accordance with the present invention are as set forth above.

When a sandblasting technique is utilized to form aperture 640 shown in FIG. 17, two stencils are preferably used. A first stencil includes a small opening used while forming aperture 640 extending between rear face 612 and front face 614. Then a second stencil replaces the first, and preferably includes a larger opening so that the annular portion of sacrificial layer 620 can be removed.

It is noted that certain methods of removing sacrificial layer require the sacrificial layer to be more brittle in nature. For instance, the sandblasting technique described above is more effectively carried out with a more brittle sacrificial layer, so that the sand-based material does not become embedded in the sacrificial layer rather than breaking and removing same.

Figure 23:
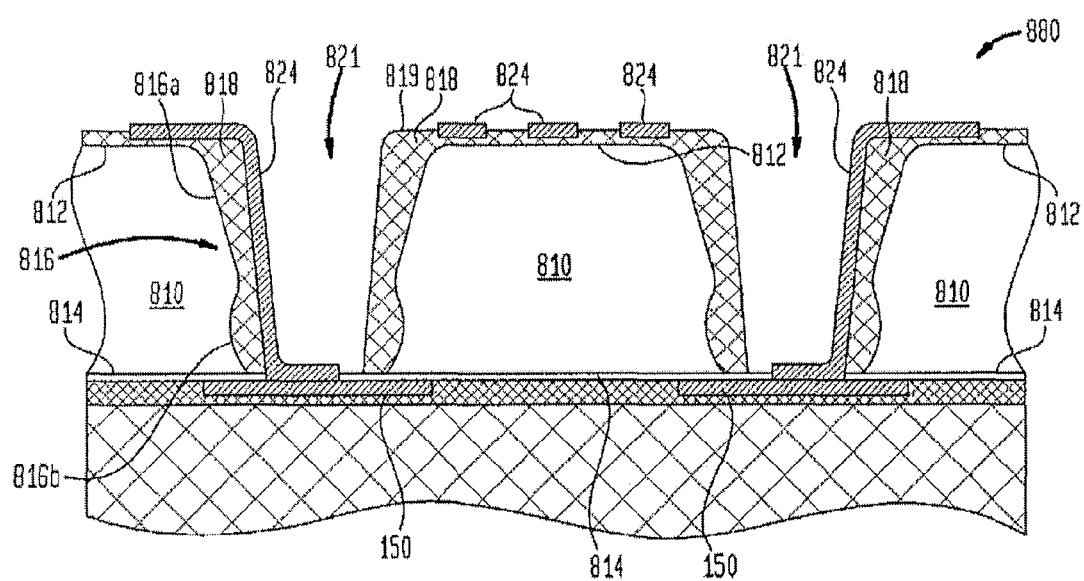
FIG. 23 is a sectional view of another embodiment of an assembly in accordance with the present invention.

Another embodiment of the present invention is shown in FIG. 23 as assembly 880, which includes a substrate 810 having a rear face 812 and a front face 814. Assembly 880 differs from the above embodiments primarily because it includes a two-staged via 821 defined by sloping surface 816 extending from rear face 812 toward front face 814. Sloping surface 816 includes a first sloping surface 816*a* and a second sloping surface 816*b*. First sloping surface 816*a* may be formed by any conventional method, and is preferably formed by a method described above. Second sloping surface 816*b* can also be formed by any conventional method, and is preferably formed by wet etching. Thus, sloping surface 816 includes a non-uniform shape in a direction between rear face 812 and front face 814. A dielectric region 818 is provided overlying at least sloping surface 816 and preferably also rear surface 812. Conductive elements 824 are plated at different locations along a top (exposed) surface 819 of dielectric region 818 according to the methods described above. As shown in FIG. 23, certain conductive elements 824 may extend from rear surface 812 to front surface 814 along sloping surface 816. As seen in FIG. 23, the conductive elements 824 do not conform to contours of the sloping surfaces 816*a* and 816*b* over which they are disposed. Rather, the conductive elements 824 can conform to a contour of an opening that is made in the dielectric region 818 overlying the sloping surfaces 816*a*, 816*b*. Adjacent front surface 814, one or more conductive elements 824 may be in connection with a conductive pad 150. Additional conductive elements may be disposed solely along top surface 819 of dielectric region 818 overlying rear surface 812 of substrate 810. As will be understood by a person having ordinary skill in the art, the above-described methods may be utilized to form an assembly 880 with any number of different configurations and capabilities depending on the desired positions of conductive elements 824.

In particular embodiments discussed above, the resulting assemblies can be or include a microelectronic unit having active circuit elements, e.g., transistors, diodes, or other microelectronic or microelectromechanical devices therein, among others, and have traces formed non-photolithographically as described above. Also in certain embodiments discussed above, the resulting assemblies can be or include an interposer structure having a substrate of at least one of semiconductor or dielectric material which has traces formed non-photolithographically as described above but which does not have active circuit elements therein. An interposer structure or component in accordance such embodiments can have conductive elements exposed at one or more of the front and rear faces for interconnection with one or more external components such as, for example, a microelectronic element, substrate or circuit panel.

Figure 24:
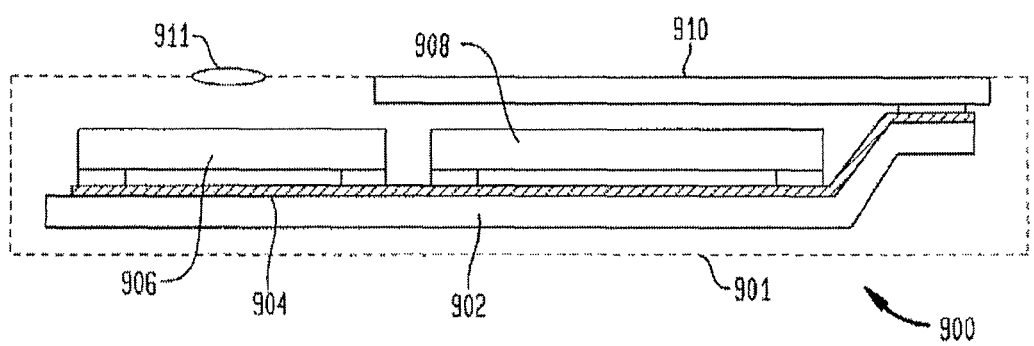
FIG. 24 is a schematic depiction of a system according to one embodiment of the invention.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory. The structures discussed above can be utilized in construction of diverse electronic systems. For example, a system 900 in accordance with a further embodiment of the invention includes a structure 906 as described above in conjunction with other electronic components 908 and 910. In the example depicted, component 908 is a semiconductor chip whereas component 910 is a display screen, but any other components can be used. Of course, although only two additional components are depicted in FIG. 24 for clarity of illustration, the system may include any number of such components. The structure 906 as described above may be, for example, a composite chip or a structure incorporating plural chips. In a further variant, both may be provided, and any number of such structures may be used. Structure 906 and components 908 and 910 are mounted in a common housing 901, schematically depicted in broken lines, and are electrically interconnected with one another as necessary to form the desired circuit. In the exemplary system shown, the system includes a circuit panel 902 such as a flexible printed circuit board, and the circuit panel includes numerous conductors 904, of which only one is depicted in FIG. 24, interconnecting the components with one another. However, this is merely exemplary; any suitable structure for making electrical connections can be used. The housing 901 is depicted as a portable housing of the type usable, for example, in a cellular telephone or personal digital assistant, and screen 910 is exposed at the surface of the housing. Where structure 906 includes a light-sensitive element such as an imaging chip, a lens 911 or other optical device also may be provided for routing light to the structure. Again, the simplified system shown in FIG. 24 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a conductive element on a substrate, the method comprising:
   (a) providing an assembly including a substrate having a front face, a rear face remote from the front face, and a sloped surface extending from the rear face toward the front face, the substrate including a region of dielectric material at at least the sloped surface, the assembly including a sacrificial layer overlying the dielectric region;
   (b) forming a groove in at least the sacrificial layer, the groove extending along and overlying at least the sloped surface, by removing a portion of the sacrificial layer by a non-photolithographic method; and
   (c) forming a conductive element having cross-sectional dimensions at least partly defined by the groove.

2. The method of claim 1, wherein the conductive element has a length extending in a first direction along the dielectric region, at least a portion of the length extending along and overlying the sloped surface, and the conductive element has a width extending in a second direction along the dielectric region, the second direction transverse to the first direction.

3. The method of claim 1, wherein step (c) includes forming a catalyst layer overlying the sacrificial layer and an exposed portion of the dielectric region, and then selectively depositing a metal onto an area where the catalyst layer is present to form the conductive element.

4. The method of claim 3, further comprising the step of removing the sacrificial layer from the assembly, thereby also removing the catalyst layer disposed on the sacrificial layer.

5. The method of claim 4, wherein the step of removing the sacrificial layer is conducted before depositing the metal such that the metal is not deposited onto areas of the sloped surface formerly occupied by a portion of the sacrificial layer on which the catalyst layer is formed.

6. The method of claim 4, wherein the step of removing the sacrificial layer is conducted after at least partly depositing the metal.

7. The method of claim 4, wherein the step of removing the sacrificial layer is conducted after partly depositing the metal, and step (c) further includes depositing metal selectively onto the partly-deposited metal after the step of removing the sacrificial layer.

8. The method of claim 1, wherein step (b) includes forming at least one additional groove, and step (c) includes forming a conductive element having cross-sectional dimensions at least partly defined by the at least one additional groove.

9. The method of claim 8, wherein the substrate includes a conductive pad exposed at the front face and a contact exposed at the rear face, the conductive elements each electrically connecting the conductive pad with the contact such that the conductive elements provide parallel electrical connections therebetween.

10. The method of claim 8, wherein the substrate includes a conductive pad exposed at the front face and a contact exposed at the rear face, wherein the impedance between the conductive pad and the contact is reduced through the parallel electrical connections of the conductive elements.

11. The method of claim 1, wherein at least a portion of the sloped surface is planar and step (b) includes forming the groove in at least the sacrificial layer overlying the planar portion.

12. A method of forming a conductive element on a substrate, the method comprising:
   (a) providing an assembly including a substrate having a front face, a rear face remote from the front face, and a sloped surface extending from the rear face toward the front face, the substrate including a region of dielectric material at at least the sloped surface, the assembly including a sacrificial layer overlying the dielectric region;
   (b) forming a groove in at least the sacrificial layer, the groove extending along at least the sloped surface, by removing a portion of the sacrificial layer by a non-photolithographic method; and
   (c) forming a conductive element having cross-sectional dimensions at least partly defined by the groove, wherein step (b) includes forming a groove in the dielectric region by removing at least a portion of the dielectric region directly beneath the portion of the sacrificial layer.

13. The method of claim 12, wherein the substrate includes a second region underlying the dielectric region and step (b) further includes removing the dielectric region at most to a depth of one half a thickness of the dielectric region above the second region.

14. The method of claim 13, wherein the second region consists essentially of monocrystalline semiconductor material, and the dielectric region includes a layer of dielectric material conforming to a contour of a sloped surface of the second region.

15. The method of claim 14, wherein the substrate is a microelectronic element having a microelectronic device disposed therein, the microelectronic element having at least one conductive pad at the front face, the conductive element being electrically connected to the at least one pad.

16. The method of claim 15, wherein step (c) further includes forming a contact exposed at the rear face of the microelectronic element, the conductive element electrically connecting the at least one conductive pad with the at least one contact.

17. The method of claim 12, wherein the conductive element conforms to a surface of the groove.

18. The method of claim 12, wherein the conductive element does not conform to a surface of the groove.

19. The method of claim 12, wherein the conductive element is at least partially embedded within the groove in the dielectric region.

20. The method of claim 19, wherein the conductive element extends from within the groove in the dielectric region to a height above an exposed surface of the dielectric region.

* * * * *